(12) United States Patent
Tsinker

(10) Patent No.: US 6,262,624 B1
(45) Date of Patent: Jul. 17, 2001

(54) PHASE DELAY BASED FILTER TRANSCONDUCTANCE (GM/C) COMPENSATION CIRCUIT

(75) Inventor: Vadim Tsinker, Belmont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/574,953

(22) Filed: May 19, 2000

(51) Int. Cl.[7] .................................................. H03K 5/00
(52) U.S. Cl. ............................................ 327/553; 327/552
(58) Field of Search ...................................... 327/552, 553, 327/555, 556, 557, 558, 559, 156

(56) References Cited

U.S. PATENT DOCUMENTS

| 5,192,884 | 3/1993 | Kusano | 327/552 |
|---|---|---|---|
| 5,200,716 | * 4/1993 | Amano | 327/553 |
| 5,912,589 | 6/1999 | Khoury et al. | 330/261 |
| 5,963,084 | 10/1999 | Eschauzier | 327/553 |
| 6,107,870 | * 8/2000 | Kawano | 327/553 |

* cited by examiner

Primary Examiner—Dinh T. Le
(74) Attorney, Agent, or Firm—Renner, Otto, Boisselle & Otto, LLP

(57) ABSTRACT

A filter compensating circuit having a sine wave generator, the sine wave generator generating a sine wave; a filter coupled to the sine wave generator and delaying a phase of the sine wave; a filter sine to square wave converter coupled to the filter and converting the delayed sine wave into a filter square wave signal; a reference sine to square wave converter coupled to the sine wave generator and converting the sine wave into a reference square wave signal; a comparator coupled to the filter sine to square wave converter and to the reference sine to square wave converter, the comparator comparing a phase relationship between the filter square wave signal and the reference square wave filter; and a correction signal generator coupled to the comparator, the correction signal generator generating a correction signal based on the comparison of the phase relationship, the correction signal being feedback to the filter to adjust a transconductance of the filter.

16 Claims, 4 Drawing Sheets

PHASE DELAY BASED FILTER TRANSCONDUCTANCE (GM/C) COMPENSATION CIRCUIT

TECHNICAL FIELD

The present invention generally relates to electrical signal filters and, more particularly, to a temperature and process compensation circuit for an electrical signal filter.

BACKGROUND ART

There is an ever present demand for analog data signal filters. Many signal filters, such as those constructed with a differential operational amplifier, do not have stable gain-bandwidth products, or transconductance (Gm/C). The Gm/C of a signal filter varies with fluctuations in temperature and process characteristics. Process characteristics are physical and/or chemical properties resulting from the manufacturing process. If the Gm/C of the filter is allowed to fluctuate, the filter's transfer characteristic will become erratic and may drift outside acceptable operating parameters.

Some techniques for adjusting the Gm/C of filters are known. However, most of these techniques lack sufficient sensitivity to invoke a fast and accurate response to Gm/C changes of the filter. Therefore, there exists a need in the art for circuits, and associated methods, for regulating the Gm/C of data signal filters.

SUMMARY OF THE INVENTION

According to one aspect of the present invention, the present invention is a filter compensation circuit. The filter compensating circuit having a sine wave generator, the sine wave generator generating a sine wave; a filter coupled to the sine wave generator and delaying a phase of the sine wave; a filter sine to square wave converter coupled to the filter and converting the delayed sine wave into a filter square wave signal; a reference sine to square wave converter coupled to the sine wave generator and converting the sine wave into a reference square wave signal; a comparator coupled to the filter sine to square wave converter and to the reference sine to square wave converter, the comparator comparing a phase relationship between the filter square wave signal and the reference square wave filter; and a correction signal generator coupled to the comparator, the correction signal generator generating a correction signal based on the comparison of the phase relationship, the correction signal being fed back to the filter to adjust a transconductance of the filter.

According to another aspect of the invention, the invention is a data filter for conditioning a data signal. The data filter has a compensation circuit, the compensation circuit having a proxy filter, a comparator and a compensation signal generator, the proxy filter delaying a reference signal, the comparator comparing a phase difference between the reference signal and the delayed reference signal and the compensation signal generator generating a correction signal feedback to the data filter and the proxy filter to adjust the transconductance of the data filter and the proxy filter.

According to another aspect of the invention, the invention is a method of adjusting Ai transconductance of a data filter. The method having the steps of generating a sine wave; delaying the sine wave with a proxy filter; converting the delayed sine wave to a filtered square wave signal; converting the sine wave into a reference square wave signal; comparing a phase relationship between the filter square wave signal and the reference square wave signal; and generating a correction signal based on the comparison of the phase relationship and feeding the correction signal back to the data filter and the proxy filter to adjust transconductance of the filters.

According to another aspect of the invention, the invention is a method of adjusting a data filter, the data filter used to condition a data signal. The method having the steps of: providing a proxy filter; delaying a reference signal with the proxy filter; comparing a phase difference between the reference signal and the delayed reference signal; generating a correction signal based on the phase difference; and adjusting the transconductance of the data filter and the proxy filter with the correction signal.

BRIEF DESCRIPTION OF DRAWINGS

These and further features of the present invention will be apparent with reference to the following description and drawings, wherein.

DISCLOSURE OF INVENTION

Introduction

Figure 1:
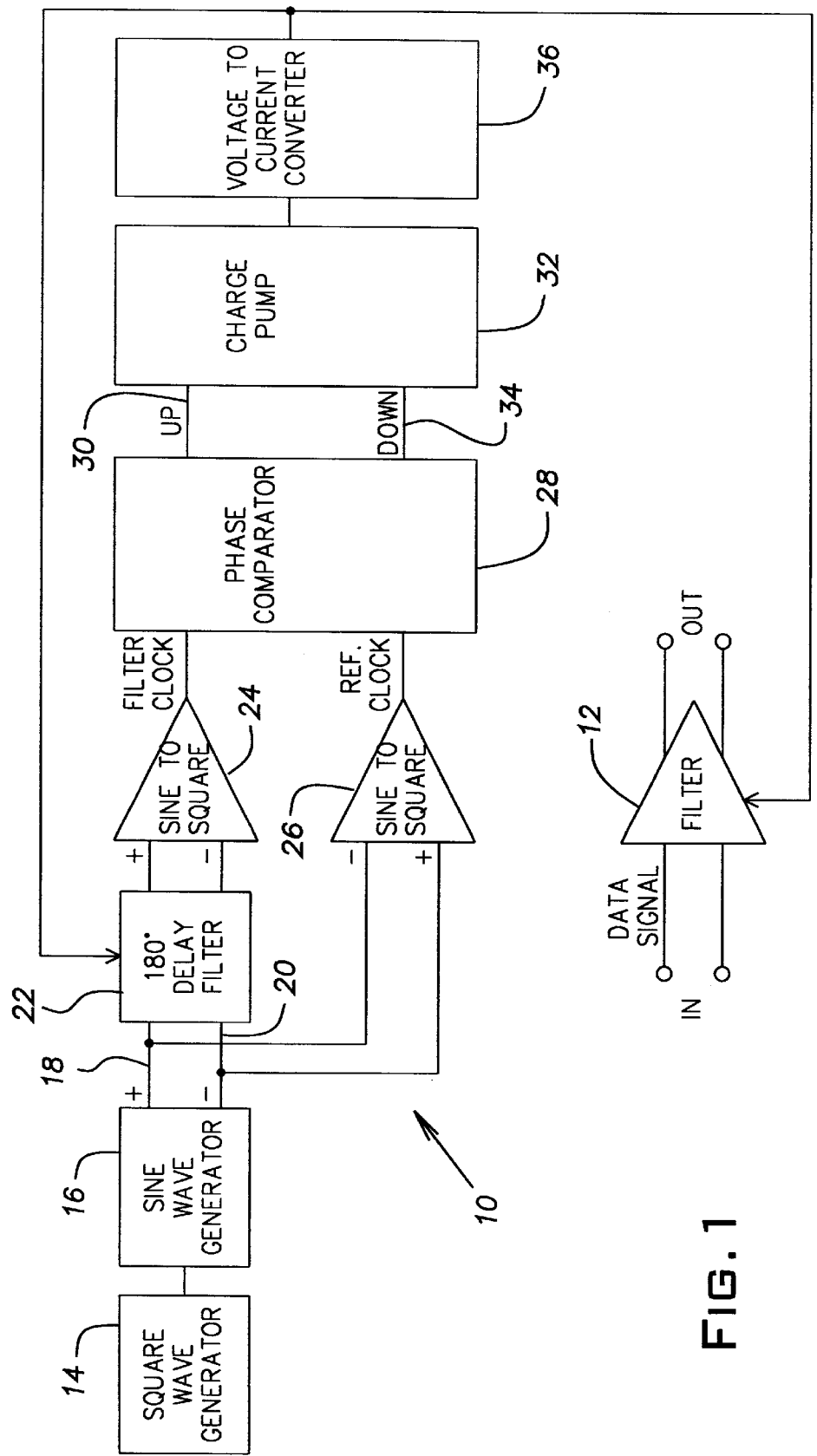
FIG. 1 is a block diagram of a transconductance compensation circuit according to the present invention.

In the detailed description which follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

Transconductance Compensation Circuit

Referring to FIG. 1, a block diagram of a transconductance compensation circuit 10 is illustrated. The transconductance compensation circuit 10 compensates for temperature and process variations (i.e., physical and/or chemical variations introduced during the manufacturing process) to maintain a desired transfer characteristic of a data signal filter 12. The data filter 12 can be used to condition an electrical signal such as a data signal received over an in-home data network operating over a conventional RJ1 1 telephone line. In general, the circuit 10 adjusts transconductance (Gm/C), or gain bandwidth product, of the data filter 12 based on monitoring a phase delay of a proxy filter having similar characteristics to the data filter 12. Therefore, no direct monitoring of the data filter 12 is made to minimize disruption of the performance of the data filter 12 otherwise caused by direct monitoring techniques.

The compensation circuit 10 has a clock generator, or square wave generator 14, for generating a square wave. The square wave is a rail-to-rail signal having a voltage amplitude referenced to ground or other voltage potential. As used herein, the term rail-to-rail square wave signal means a square wave that, when low, is set to a voltage supplied by a first power rail (e.g., ground) and, when high, is set to a voltage supplied by a second power rail (e.g., $V_{DD}$ or about 3 to 3.6 volts). The square wave has a selectable frequency. For example, the frequency of the square wave in one embodiment is about 1 MHZ to about 500 MHZ or higher, and in one embodiment about 15 MHZ to 16 MHZ. As discussed below in more detail, reference and filter clock signals are derived from the square wave and have about the same frequency as the square wave.

The square wave is output from the square wave generator 14 and received by an input of a sine wave generator 16 coupled to an output of the square wave generator 14. The sine wave generator 16 converts the square wave into a sine wave. The sine wave is output from an output of the sine wave generator 16 and has characteristics to approximate characteristics of the data signal. For example, the sine wave is a differential (i.e., self-referenced) signal carried on a pair of conductors and the amplitude of the sine wave is limited to a few tenths of a volt (e.g., in one embodiment about 0.1 volts to 0.5 volts, and in one embodiment about 0.3 volts).

For a more detail discussion of the square wave generator 14 and the sine wave generator 16, attention is directed to U.S. patent application Ser. No. 09/545,485 filed Apr. 10, 2000, which is incorporated herein by reference in its entirety. Briefly, the sine wave generator 16 is a three stage device. The first stage is a clipper for clipping both the low and high portions of the square wave to a specified voltage and for converting the square wave to a differential signal. The second stage is an attenuator/filter which attenuates the signal to the desired output amplitude and performs some low pass filtering of the signal. The third stage is a low pass filter for shaping the waveform into a sine wave.

The output of the sine wave generator 16 is differential and connected to a pair of conductors. A first conductor of the pair of conductors, or positive conductor 18, is coupled to a positive output terminal of the differential output. A second conductor of the pair of conductors, or negative conductor 20, is coupled to a negative output terminal of the differential output. The conductors 18, 20 are connected to inputs of a 180° phase delay proxy filter 22. The sine wave provides a frequency point for measurement by the proxy filter 22. Therefore, the sine wave acts as a test, or reference, signal for monitoring the transconductance of the proxy filter 22.

The proxy filter 22 is constructed to be similar to the data filter 12. More specifically, the filters 12, 22 are preferably constructed adjacent one another on the same integrated circuit using the same fabrication techniques. Therefore, the transfer characteristic of the proxy filter 22 is susceptible to temperature variations and process variations similar to the transfer characteristic susceptibilities of the data filter 12. Any measurable changes to the transfer characteristics of the proxy filter 22 can be monitored as an indication of transfer characteristic changes of the data filter 12. Compensation can be applied to the proxy filter 22 to adjust the Gm/C of the proxy filter 22 to compensate for temperature and process variations thereby bringing the transfer characteristics within normal, acceptable tolerances. Since the susceptibilities of the proxy filter 22 and the data filter 12 are, or are assumed to be, very similar, the same compensation can be applied to data filter 12 to bring the transfer characteristics of the data filter 12 within normal, acceptable tolerances.

The proxy filter 22 has transfer characteristics that are similar or identical to the data filter 12. It is noted that the example data filter 12 is a low pass filter implemented with known transconductance filter designs. Therefore, the proxy filter is also a low pass filter and is used to introduce a phase shift, or delay. The proxy filter 22 can be implemented with known transconductance filter designs. Assuming the Gm/C of the proxy filter 22 is correctly adjusted, the proxy filter 22 introduces a 180° phase shift to the sine wave. The phase shift can be introduced in one or more stages. For example, the proxy filter 22 can have two stages, each shifting the sine wave by 90° for a total of 180° phase delay. One skilled in the art will appreciate that the data filter 12 and the proxy filter 22 can be configured as needed, such as a low pass filter, a high pass filter, notch filter, band pass filter or the like, as long as the proxy filter 22 delays the sine wave so that variations in Gm/C can be monitored and Gm/C changes in both filters 12, 22 with respect to temperature and process variations are designed to be substantially the same so as to provide a proper proxy operation of the correction circuit 10.

As will become more apparent below, the 180° phase shift introduced by the proxy filter 22 has at least two advantages over other delays, such as a single 90° phase shift. These advantages include ease of Gm/C correction since a small Gm/C error will result in a proportionately larger phase shift error which is more easily detectable. The 180° phase shift also allows for a comparison of the phase difference between the rising or falling edges of the signal output by the proxy filter 22 and a reference signal as discussed in more detail below.

The proxy filter 22 outputs a 180° phase delayed sine wave at a differential output of the proxy filter 22. The output of the proxy filter 22 is connected to an input of a first, or filter, sine to square wave converter 24. The filter sine to square wave converter 24 can be implemented with a known differential operational amplifier circuit having an inverting input and a noninverting input. The inverting and non-inverting inputs are respectively connected to the output of the proxy filter 22 so that the non-inverting input is effectively coupled to the positive output of the sine wave generator 16 via the proxy filter 22 and the positive conductor 18 and the inverting input is effectively coupled to the negative output of the sine wave generator 16 via the proxy filter 22 and the negative conductor 20. The filter sine to square wave converter 24 converts the delayed sine wave from the proxy filter 22 into a square wave, or filter clock signal, which is output from an output of the filter sine to square wave converter 24. The filter clock signal is not changed in phase (i.e., not inverted) by the filter sine to square wave converter 24. However, the filter sine to square wave converter 24 also amplifies the filter clock signal so that when the filter clock signal is high the filter clock signal has an amplitude of about 3 to 4 volts which can represent a logical high and when the filter clock signal is low the filter clock signal has an amplitude of about zero volts which can represent a logical low. It is noted that the amplification can take place in another stage, such as a separate amplifier or triggering circuit.

The conductors 18, 20 are also connected to an input of a second, or reference, sine to square wave converter 26 for converting the sine wave generated by the sine wave generator 16 into a square wave, or reference clock signal. The reference sine to square wave converter 26 can be implemented with a known differential operational amplifier circuit having a non-inverting and an inverting input. The positive conductor 18 is connected to the inverting input and the negative conductor 20 is connected to the non-inverting input. Therefore, the reference sine to square wave converter 26 also inverts the sine wave. The reference clock signal is output from the reference sine to square wave converter 26 at an output of the reference sine to square wave converter 26. However, the reference sine to square wave converter 26 also amplifies the reference clock signal so that when the reference clock signal is high the reference clock signal has an amplitude of about 3 to 4 volts which can represent a logical high and when the reference clock signal is low the reference clock signal has an amplitude of about zero volts which can represent a logical low. It is noted that the amplification can take place in another stage, such as a separate amplifier or triggering circuit.

Alternatively, the filter sine to square wave converter 24 can be configured to invert the delayed sine wave and the reference sine to square wave converter 26 can be configured to not s change the phase (i.e., not invert) the sine wave. In another alternative embodiment, both or neither of the converters 24, 26 are configured to invert their respective signals and the proxy filter 22 is configured to invert the sine wave signal processed by the proxy filter 22. In any case, the rising edges of the reference and filter clock signals are output from their respective sine to square wave converters 24, 26 to be in phase, assuming the Gm/C of the proxy filter 22 is properly adjusted.

Figure 4:
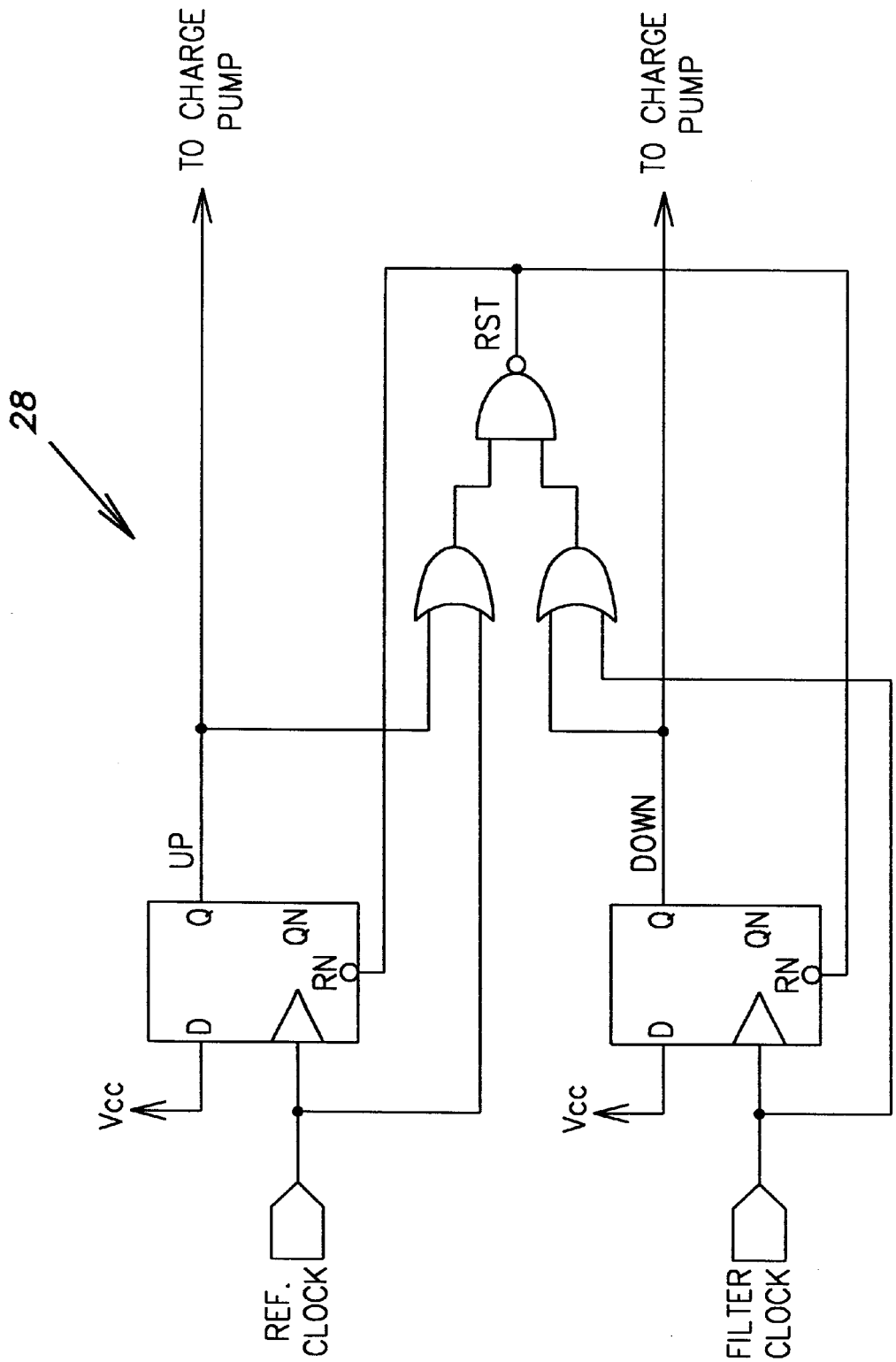
FIG. 4 is a schematic of a first example phase comparator for use with the transconductance compensation circuit.
Figure 5:
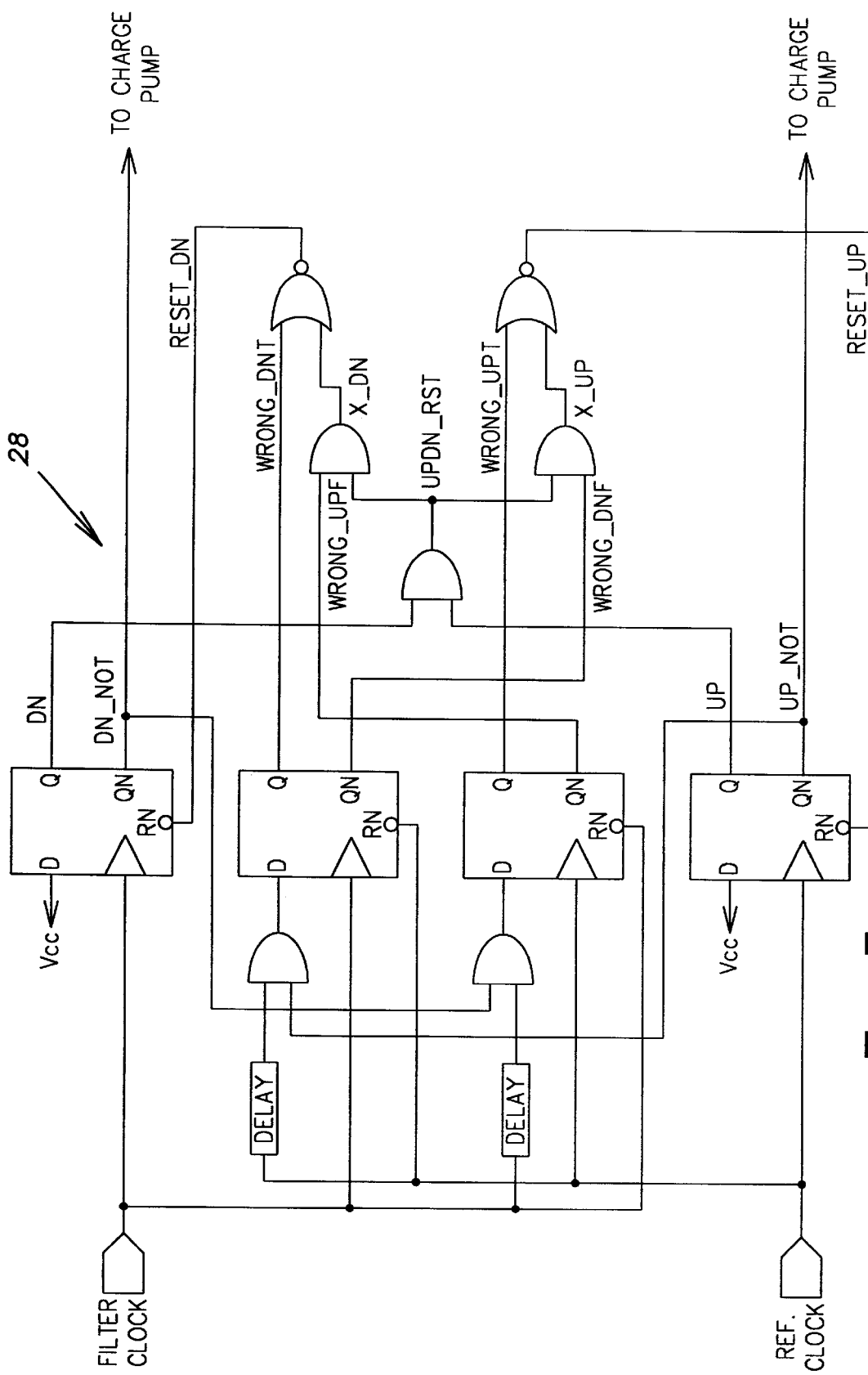
FIG. 5 is a schematic of a second example phase comparator for use with the transconductance compensation circuit.

The outputs of the filter sine to square wave converter 24 and the reference sine to square wave inverter 26 are connected to inputs of a phase comparator 28. Two example circuits that can be used to implement the phase comparator 28 are illustrated in FIGS. 4 and 5 respectively. Briefly, the phase comparator 28 compares the phase of the reference clock signal with the filter clock signal.

Figure 2:
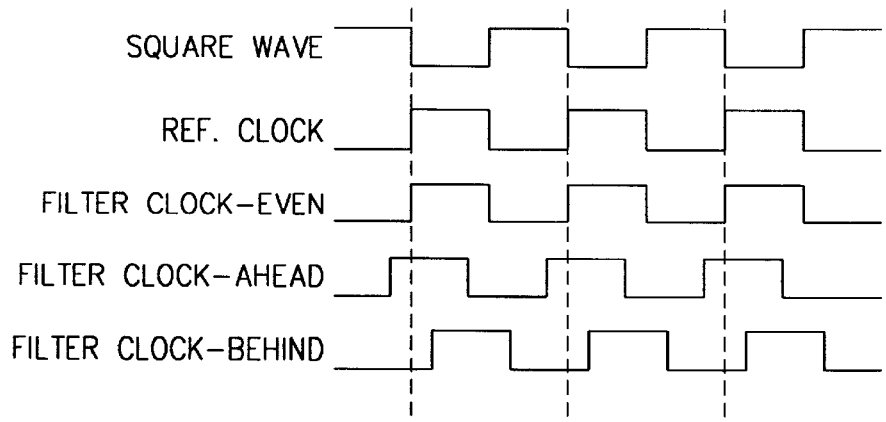
FIG. 2 is a timing diagram illustrating a portion of the operation of the present invention.

Referring to FIG. 2, the general operation of the compensation circuit 10 will be explained in greater detail. FIG. 2 illustrates five waveforms. The top waveform in FIG. 2 represents the square wave output of the square wave generator 14. The square wave is subsequently converted to a sine wave by the sine wave generator 16 and converted back into a square wave by the reference sine to square wave converter 26 as the reference clock signal (the second wave form in FIG. 2). As illustrated in FIG. 2, the reference clock signal is an inverted representation of the original square wave and has substantially the same frequency as the square wave.

With continued reference to FIG. 2, three variations of the filter clock signal are represented. More specifically, the three filter clock signals represent when the filter clock signal is substantially in phase with the reference clock signal (i.e., even), when the filter clock signal leads (i.e., is ahead of) the reference clock signal, and when the filter clock signal lags (i.e., is behind) the reference clock signal. The phase comparator 28 detects the phase of the filter clock signal relative to the reference clock signal. When the phase of the reference and filter clock signals are substantially in phase, the Gm/C of the proxy filter 22 is adjusted within acceptable parameters. When the phase of the reference and filter clock signals are not in phase, the Gm/C of the proxy filter 22 is not adjusted within acceptable parameters.

As is similarly done in phase lock loop (PLL) circuits, the phase comparator will generate control signals for a correction signal generator. The correction signal generator has a charge pump and optionally a voltage to current converter. The control signals are "up" signal pulses carried on a first, or up, conductor 30, and "down" signal pulses carried on a second, or down, conductor 34. The up and down pulses are proportional to the phase difference, if any, between the reference and filter clock signals. Therefore, the up and down signal pulses are indicative of a phase relationship between the reference clock signal and the filter clock signal. The up conductor 30 and the down conductor 34 are connected to a charge pump 32. The charge pump 32 produces a variable voltage signal at an output of the charge pump 32. The output of the charge pump 32 is connected to an input of a voltage to current converter 36. The voltage to current converter circuit 36 converts the voltage present at the voltage output of the charge pump 32 to a current signal output at an output of the voltage to current converter 36. The output of the voltage to current converter is connected to Gm/C current correction inputs of both the data filter 12 and the proxy filter 22.

The number, duration and phase of the up and down signal pulses will be substantially equal when the filter and reference clock signals are substantially in phase. Under this condition, the charge pump 32 will output a substantially constant voltage, leading to a substantially constant current, or correction signal, being fed back from the voltage to current converter 36 to the filters 12, 22. It is noted that the if the Gm/C of the proxy filter 22 is determined to be acceptably adjusted, then the Gm/C of the data signal filter 12 is assumed to be also acceptably adjusted.

When the filter clock signal lags the reference clock signal, the Gm/C of the proxy filter 22 should be increased. It is noted that if the Gm/C of the proxy filter 22 is in need of adjustment, it is assumed that the data filter 12 is also in need of similar adjustment. When the foregoing phase difference is detected by the phase comparator 28, the phase comparator 28 will output more and/or longer up pulse signals than down pulse signals. The number and duration of up pulse signals can have a magnitude proportional to the phase difference between the reference and filter clock signals. The greater number and/or magnitude (i.e., duration) of up pulse signals than down pulse signals will cause the voltage output by the charge pump to increase, thereby causing the magnitude of the correction signal (i.e., current output from the voltage to current converter 36) to increase. The correction signal is used by the filters 12, 22 to respectively adjust the Gm/C of the filters 12, 22 as is well known in the art. As the Gm/C of the proxy filter 22 is adjusted to be within an acceptable tolerance, the phase of the filter clock signal will align with the phase of the reference clock signal and the operation of the correction circuit 10 will return to the operation described above for when the filter and reference clock signals are substantially in phase.

When the filter clock signal is ahead of the reference clock signal, the Gm/C of the proxy filter 22 should be decreased. When the foregoing phase difference is detected by the phase comparator 28, the phase comparator 28 will output more and/or longer down pulse signals than up pulse signals. The number and duration of down pulse signals can have a magnitude proportional to the phase difference between the reference and filter clock signals. The greater number and/or magnitude (i.e., duration) of down pulse signals than up pulse signals will cause the voltage output by the charge pump to decrease, thereby causing the magnitude of the correction signal (i.e., current output from the voltage to current converter 36) to decrease. The correction signal is used by the filters 12, 22 to respectively adjust the Gm/C of the filters 12, 22 as is well known in the art. As the Gm/C of the proxy filter 22 is adjusted to be within an acceptable tolerance, the phase of the filter clock signal will align with the phase of the reference clock signal and the operation of the correction circuit 10 will return to the operation described in above for when the filter and reference clock signals are substantially in phase.

In summary, the current signal is a correction signal for adjusting the Gm/C of the proxy filter 22 and the data filter 12 based on the phase difference between the filter clock signal and the reference clock signal.

In an alternative arrangement, the proxy filter 22 can have transfer characteristic susceptibilities which are proportional, or are in a known relationship to, the transfer characteristic susceptibilities of the data filter 12, rather than being substantially the same. In this case, the correction signal can be modified (e.g., amplified or attenuated) before being feedback to one of the proxy filter 22 or the data filter 12. Alternatively, the voltage to current converter circuit 36 can have two outputs which respectively provide a proxy filter correction signal and a data filter correction signal.

Example Use of Transconductance Compensation Circuit

Figure 3:
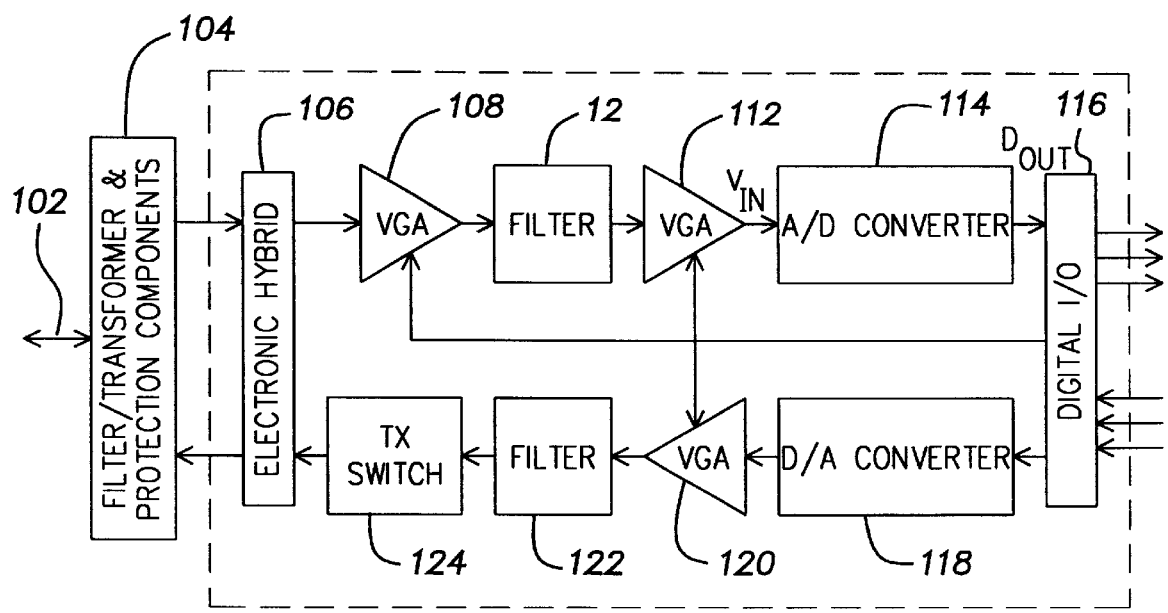
FIG. 3 is a block diagram of an analog front end circuit having a filter which includes the transconductance compensation circuit.

The correction circuit 10 of the present invention is well suited for use in a variety of applications where data signal filters are used. As an example, FIG. 3 illustrates a block diagram showing an analog front end circuit 100, or physical layer, of a networking device, such as a 10 Mbps or higher bandwidth in-home data network operating over a conventional RJ11 telephone line 102, or plain old telephone system (POTS). The analog front end circuit receives data signals from the telephone line 102 via circuit 104 having components to condition the data signal, such as filters, transformers and surge protection. The received signals are processed by an electronic hybrid circuit 106 to perform functions such as collision detection. Next, the received signals are passed first through a variable gain amplifier (VGA) 108, the data filter 12 being adjusted by the transconductance compensation circuit 10 of the present invention (not shown in FIG. 3), and a second VGA 112 to further condition the received signals. The data filter 12, is, for example, a transconductance (Gm/C) low pass filter for filtering out high frequency components of the data signal.

The conditioned received signal is input into an analog to digital (A/D) converter 114. The A/D converter 114 converts the analog data input signals into a digital output which is then sent from the A/D converter 114 to a digital input/ output (I/O) circuit 116. The digital I/O circuit 116 acts as an interface between the analog front end circuit 100 and a subsequent network device circuit, such as a circuit to implement the data link layer of an open systems interconnection (OSI) protocol stack.

Digital data output signals received from the subsequent network device circuit by the analog front end circuit 100 are received by the digital I/O circuit 116. The digital data output signals are converted to a transmit analog signal by a digital to analog (D/A) converter 118. The transmit analog signal is conditioned by a third VGA 120. The third VGA 120 acts as an adjustable gain transmit attenuator to allow for flexibility in setting the transmit power of the analog front end circuit 100. The attenuated transmit signal is further conditioned by a filter 122. Like the data filter 12, the filter 122 can also be a transconductance (Gm/C) filter which is adjusted by a transconductance compensation circuit, such as the transconductance compensation circuit 10 as described herein. The filtered, attenuated transmit signal is optionally passed through a transmit switch 124 before being sent to the telephone line 102 through the electronic hybrid circuit 106 and the circuit 104.

The analog front end circuit 100, including the filter 12 and compensation circuit 10, can be implemented as part of an integrated circuit, made using known integrated circuit manufacturing technology in a medium such as 0.35 μm CMOS.

Conclusion

Although particular embodiments of the invention have been described in detail, it is understood that the invention is not limited correspondingly in scope, but includes all changes, modifications and equivalents coming within the spirit and terms of the claims appended hereto.

What is claimed is:

1. A filter compensation circuit comprising:
   a sine wave generator, the sine wave generator generating a sine wave;
   a filter coupled to the sine wave generator and delaying a phase of the sine wave;
   a filter sine to square wave converter coupled to the filter and converting the delayed sine wave into a filter square wave signal;
   a reference sine to square wave converter coupled to the sine wave generator and converting the sine wave into a reference square wave signal;
   a comparator coupled to the filter sine to square wave converter and to the reference sine to square wave converter, the comparator comparing a phase relationship between the filter square wave signal and the reference square wave filter; and
   a correction signal generator coupled to the comparator, the correction signal generator generating a correction signal based on the comparison of the phase relationship, the correction signal being fed back to the filter to adjust a transconductance of the filter.

2. The filter compensation circuit according to claim 1, wherein the filter delays the sine wave by 180 degrees.

3. The filter compensation circuit according to claim 1, wherein the sine wave generator is coupled to a square a square wave generator for receiving a square wave, the sine wave generator converting the square wave to a differential sine wave.

4. The filter compensation circuit according to claim 1, wherein the filter is a low pass filter.

5. The filter compensation circuit according to claim 1, wherein the reference sine to square wave converter inverts the sine wave.

6. The filter compensation circuit according to claim 1, wherein the correction signal generator is a voltage to current converter and the correction signal is a current signal for adjusting the transconductance of the filter.

7. The filter compensation circuit according to claim 1, wherein the correction signal is fed back to a second filter for adjusting the transconductance of the second filter, the second filter used to condition a data signal.

8. A data filter system for conditioning a data signal, the data filter system comprising:
   a data signal filter, the data signal filter conditioning the data signal and having a transconductance adjusted by a correction signal; and
   a compensation circuit for generating the correction signal, the compensation circuit comprising:
      a proxy filter, the proxy filter delaying a reference signal, the reference signal being a sine wave;
      a first sine to square wave converter for converting the filtered reference signal into a filtered square wave;
      a second sine to square wave converter for converting the reference signal to a reference square wave;
      a comparator, the comparator comparing a phase difference between the filtered square wave and the reference square wave; and
      a compensation signal generator for generating the correction signal, the correction signal being feedback to the data signal filter and the proxy filter to adjust the transconductance of the data signal filter and a transconductance of the proxy filter.

9. The data filter system according to claim 8, wherein the data signal filter has a transfer characteristic susceptible to temperature and process variation and the proxy filter is a low pass filter having transfer characteristic susceptibilities substantially similar to that of the data signal filter.

10. The data filter system according to claim 8, wherein the proxy filter delays the reference signal by a phase of 180 degrees.

11. A method of adjusting transconductance of a data filter, comprising the steps of:

generating a sine wave;

delaying the sine wave with a proxy filter;

converting the delayed sine wave to a filtered square wave signal;

converting the sine wave into a reference square wave signal;

comparing a phase relationship between the filter square wave signal and the reference square wave signal; and generating a correction signal based on the comparison of the phase relationship and feeding the correction signal back to the data filter and the proxy filter to adjust transconductance of the filters.

12. The method according to claim 11 wherein the proxy filter delays the sine wave by 180 degrees.

13. The method according to claim 11, wherein the proxy filter is a low pass filter and delays the sine wave by 180 degrees.

14. The method according to claim 11, further comprising the step of inverting the reference square wave signal.

15. The method according to claim 11, wherein the data filter has a transfer characteristic susceptible to temperature and process variations and the proxy filter is a low pass filter having transfer characteristic susceptibilities substantially similar to that of the data filter.

16. The method according to claim 11, further comprising the step of inverting the sine wave.

* * * * *

UNITED STATES PATENT AND TRADEMARK OFFICE
CERTIFICATE OF CORRECTION

PATENT NO. : 6,262,624 B1
DATED : July 17, 2001
INVENTOR(S) : Vadim Tsinker

It is certified that error appears in the above-identified patent and that said Letters Patent is hereby corrected as shown below:

Column 1,
Line 62, replace "adjusting Ai transconductance" with -- adjusting transconductance --.

Column 2,
Line 55, replace RJ1 1" with -- RJ11 --.

Column 5,
Line 16, replace "not s" with -- not --.

Column 6,
Line 66, replace "described in above" with -- described above --.

Signed and Sealed this

Twenty-ninth Day of January, 2002

Attest:

Attesting Officer

JAMES E. ROGAN
Director of the United States Patent and Trademark Office